(12) United States Patent
Kim (10) Patent No.: US 10,928,422 B2
(45) Date of Patent: Feb. 23, 2021

(54) SEMICONDUCTOR TESTING APPARATUS

(71) Applicant: WILLTECHNOLOGY CO., LTD., Gyeonggi-do (KR)

(72) Inventor: Il Kim, Gyeonggi-do (KR)

(73) Assignee: WILLTECHNOLOGY CO., LTD., Gyeonggi-do (KR)

( * ) Notice: Subject to any disclaimer, the term of this patent is extended or adjusted under 35 U.S.C. 154(b) by 0 days.

(21) Appl. No.: 14/596,762

(22) Filed: Jan. 14, 2015

(65) Prior Publication Data
US 2015/0198632 A1 Jul. 16, 2015

(30) Foreign Application Priority Data
Jan. 14, 2014 (KR) .................. 10-2014-0004576

(51) Int. Cl.
*G01R 1/073* (2006.01)

(52) U.S. Cl.
CPC ..... *G01R 1/07371* (2013.01); *G01R 1/07342* (2013.01); *G01R 1/07357* (2013.01)

(58) Field of Classification Search
CPC .................. G01R 1/07371; G01R 1/07342
USPC ........................ 324/754.07, 750.03
See application file for complete search history.

(56) References Cited

U.S. PATENT DOCUMENTS

2002/0153913 A1* 10/2002 Okubo ............... G01R 1/06716
324/754.07
2008/0054918 A1* 3/2008 Lin ..................... G01R 1/07371
324/756.03

* cited by examiner

*Primary Examiner* — Farhana A Hoque
(74) *Attorney, Agent, or Firm* — IPLA P.A.

(57) ABSTRACT

Provided is a semiconductor testing apparatus that a testing pin is rendered to electrically connect to another testing pin or an external substrate through a conductive layer formed in the guide hole, so that it results in enhancement in various characteristics such as poor electrical contact of the testing pin, space efficiency, noise, and high frequency characteristics, thereby improving reliability in testing results.

3 Claims, 7 Drawing Sheets

FIG. 1

Prior Art

SEMICONDUCTOR TESTING APPARATUS

CROSS REFERENCE

The present application claims the benefit of Korean Patent Application No. 10-2014-0004576 filed in the Korean Intellectual Property Office on 14 Jan. 2014, the entire contents of which are incorporated herein by reference.

BACKGROUND OF THE INVENTION

1. Field of the Invention

The present invention relates to a semiconductor testing apparatus, and more particularly, to a semiconductor testing apparatus in that a testing pin is rendered to electrically connect to another testing pin or an external substrate through a conductive layer formed in the guide hole, so that it results in enhancement in various characteristics such as poor electrical contact of the testing pin, space efficiency, noise, and high frequency characteristics, thereby improving reliability in testing results.

2. Description of the Related Art

A semiconductor testing process can divide into a previous process testing, which is an EDS (Electrical Die Sorting) for testing the electrical characteristic of the chip manufactured in the wafer level, and a post-processing test for testing a semiconductor IC manufactured in the package level.

In the previous process testing, in order to determine the bad chip among chips formed in the wafer, a probe card for applying the electrical signals to the chips and determining the bad chip according to the signal checked through the applied electrical signal is used as the semiconductor testing apparatus. The probe card includes a plurality of testing pins (probe needle) corresponding to the terminal of the wafer.

In the post-processing test, a test socket for applying the electrical signals to the semiconductor package of IC shape and testing the normal operation condition of the IC is used as the semiconductor testing apparatus. The test socket includes a plurality of pogo pins or conductive rubber sheets corresponding to the terminal of the IC.

Besides, the semiconductor testing apparatus includes terminals identically with the terminals of the semiconductor formed at one side thereof. In the semiconductor testing apparatus, the terminals are connected to each other or other semiconductor package is extended to one side of the semiconductor package to be connected, thereby performing the test thereof.

Figure 1:
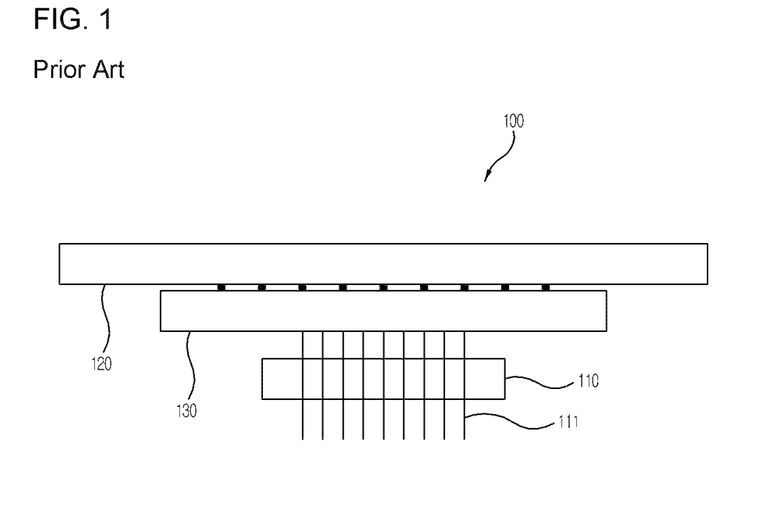
FIG. 1 is a cross-sectional view illustrating a probe card as a previous process testing apparatus according to the conventional semiconductor test apparatus.

FIG. 1 is a cross-sectional view illustrating a probe card as a previous process testing apparatus according to the conventional semiconductor test apparatus.

As shown in FIG. 1, the conventional probe card 100 includes a guide plate 110 having a plurality of testing pins 111 electrically contacted with the chips located on the testing stand; a main board 120 separated from the guide plate 110 and formed at the upper portion of the guide plate 110; and a space transformer 130 for spatially matching the electrode pattern of the guide plate 110 having a narrow pitch with the main board 120 having a wide pitch and formed between the guide plate 110 and the main board 120.

In this conventional probe card 100, when the testing pins 111 are contacted with the semiconductor under test, the electric signal is transmitted to the testing pins 111 from the semiconductor and the electrical signal transmitted to the testing pins 111 is transmitted to the probe interface board, which is not illustrated therein, through the main board 120.

Here, in the conventional probe card 100, when the lower end of the test pins 11 is electrically contacted with the semiconductor under test through a DUT (device under test), the upper end of the testing pins 111 is electrically connected to the space transformer 130. At this time, if the electrical contact between one testing pin 111 among many testing pins and the space transformer 130 is unstable, there is a problem in that the result of the DUT test becomes imprecisely. Due to this, the reliability of the test result can be remarkably degraded.

Since the semiconductor testing device tests the electrical characteristic by applying the electrical signal to the object semiconductor through the testing pins, such problem of the electric contact fault of the testing pin can be identically generated in all semiconductor testing apparatus such as not only the probe card but also the test socket etc.

Moreover, in the semiconductor testing apparatus, since it is necessary to form the multiple testing pins at the narrow space, there is a problem that the high frequency property is not poor due to the spacious restriction.

SUMMARY OF THE INVENTION

The present invention has been proposed to solve such problems of the related art, and an object of the invention is to provide a semiconductor testing apparatus in that a testing pin is rendered to electrically connect to another testing pin or an external substrate through a conductive layer formed in the guide hole, so that it results in enhancement in various characteristics such as poor electrical contact of the testing pin, space efficiency, noise, and high frequency characteristics, thereby improving reliability in testing results.

Another object of the invention is to provide a semiconductor testing apparatus in that a signal transduction length becomes short and an impedance is decreased, so that it can remarkably improve the high frequency performance.

According to an aspect of the invention to achieve the object described above, there is a provided a semiconductor testing apparatus including: a guide plate having at least one or more guide holes formed at one side thereof; a conductive layer formed at one side of an inner surface of the guide hole; at least one testing pin inserted and installed in the guide hole and having one side of an outer surface contacted with one side of the conductive layer and a lower end portion electrically contacted with a semiconductor under test; and at least one or more conductive traces formed at one side of a surface of the guide plate and having one side electrically connected to one side of the conductive layer.

Preferably, the guide plate includes an upper plate having at least one first guide hole formed at one side thereof and a lower plate coupled to the lower portion of the upper plate and having at least one second guide hole formed at one side thereof; and the conductive trace is formed on at least one surface of upper and lower surfaces of the upper plate or the lower plate.

Preferably, the conductive trace is electrically connected between the conductive layers with which the testing pins of transmitting the same signal are contacted.

Preferably, the conductive trace is electrically connected between the conductive layers with which the testing pins for ground are contacted.

Preferably, the conductive trace is extended and formed toward an area except for a testing area of a side of the guide plate, on which the testing pins are densely formed, from one side of the conductive layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, a preferred embodiment of the invention will be described in detail with reference to the accompanying drawings. Hereinafter, in order to simply make the description, the probe card will be explained as the term called as a semiconductor testing apparatus. However, the present invention is not limited to the probe card. All semiconductor testing apparatus having multiple test pins can be applied thereto.

Figure 2:
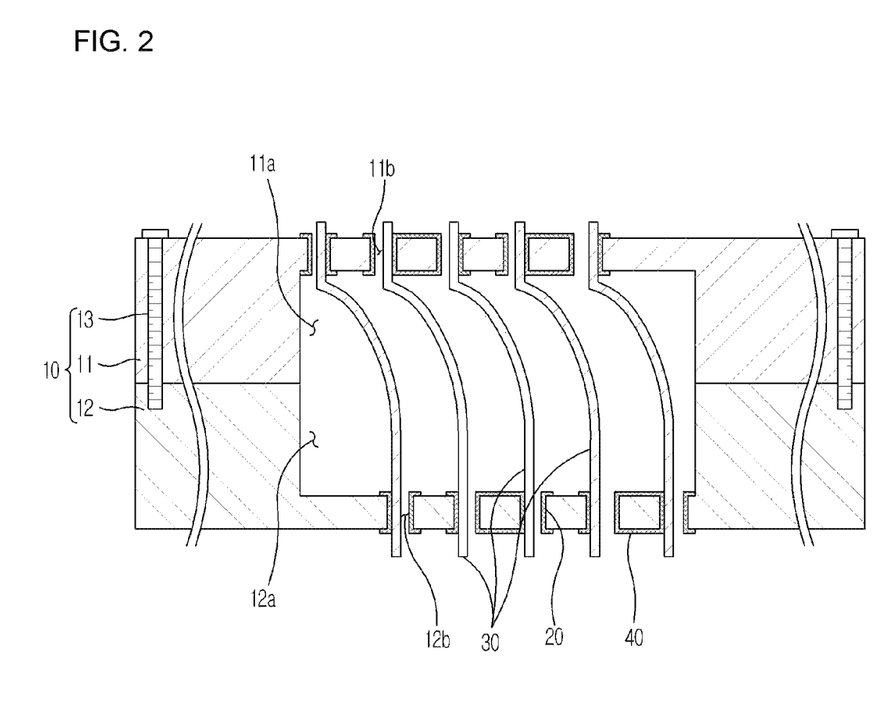
FIG. 2 is a schematic cross-sectional view showing a semiconductor testing apparatus according to one embodiment of the present invention.
Figure 3:
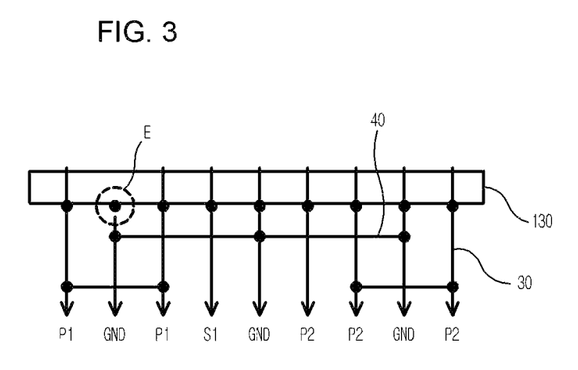
FIG. 3 is a conceptual diagram showing a state in that a conductive traces according to one embodiment of the present invention is connected between conductive layers, with which the testing pin of transmitting the same signal is contacted.
Figure 4:
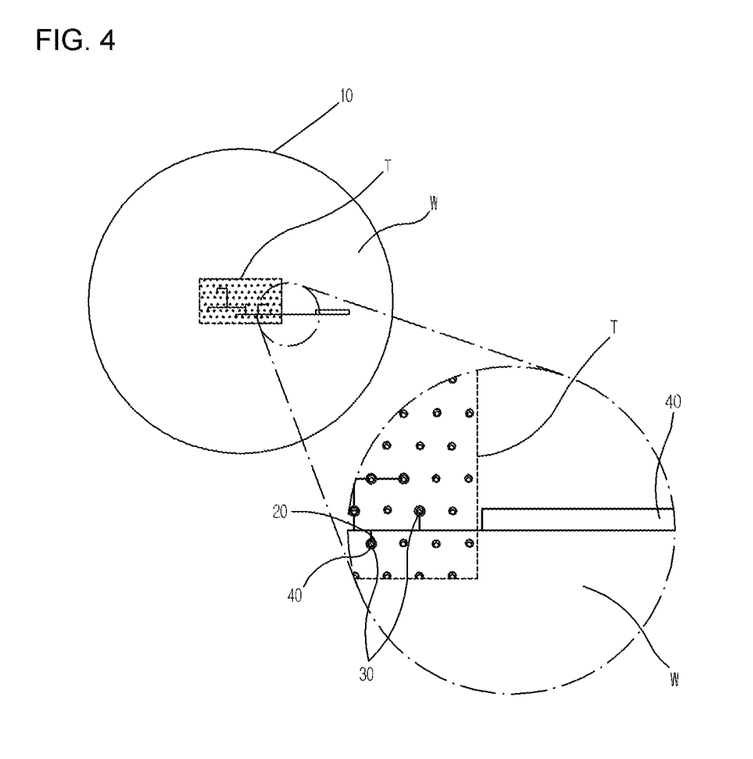
FIG. 4 is a drawing showing a state in that a conductive trace according to one embodiment of the present invention is extended.
Figure 5A:
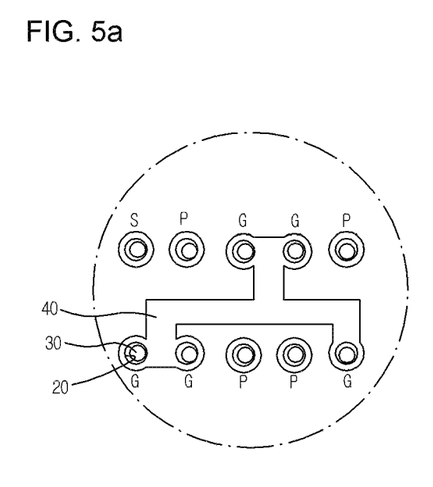
FIG. 5a is a drawing showing an upper surface of an upper plate according to one embodiment of the present invention.
Figure 5B:
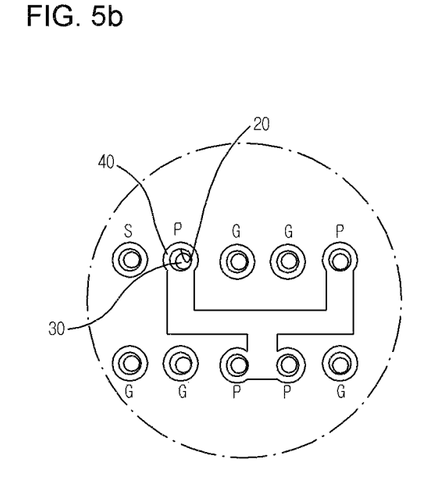
FIG. 5b is a drawing showing a lower surface of an upper plate according to one embodiment of the present invention.
Figure 6:
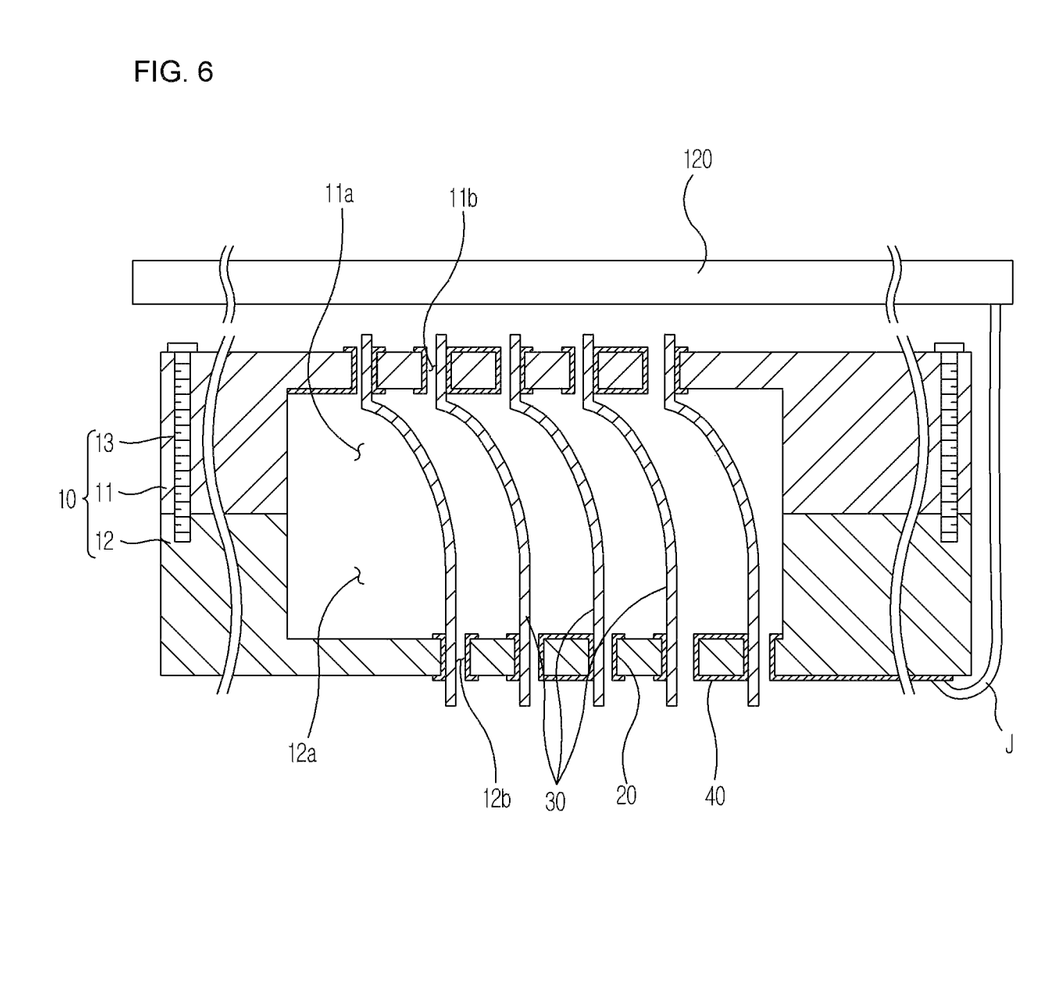
FIG. 6 is a drawing showing a state in that a conductive trace according to one embodiment of the present invention is connected to a main board through a wire.

FIG. 2 is a schematic cross-sectional view showing a semiconductor testing apparatus according to one embodiment of the present invention; FIG. 3 is a conceptual diagram showing a state in that a conductive traces according to one embodiment of the present invention is connected between conductive layers, with which the testing pin of transmitting the same signal is contacted; FIG. 4 is a drawing showing a state in that a conductive trace according to one embodiment of the present invention is extended; FIG. 5a is a drawing showing an upper surface of an upper plate according to one embodiment of the present invention; FIG. 5b is a drawing showing a lower surface of an upper plate according to one embodiment of the present invention; and FIG. 6 is a drawing showing a state in that a conductive trace according to one embodiment of the present invention is connected to a main board through a wire.

As shown in the FIG. 2 through FIG. 6, the semiconductor testing apparatus 1 according to one embodiment of the present invention includes a guide plate 10, a conductive layer 20, a testing pin 30, and conductive traces 40.

The guide plate 10 includes an upper plate 11 having a plurality of first guide holes 11b at a side thereof, a lower plate 12 coupled to the lower portion of the upper plate 11 and having a plurality of second guide holes 12b at a side thereof, and a coupling member 13 for coupling the upper plate 11 to the lower plate 12. The guide plate 10 serves to support the testing pin 30 and provide the forming area of the conductive trace 40 which will be described later.

The upper plate 11 is in the form of a circular or a rectangular plate shape and has a first containing groove 11a formed on one side of a lower surface thereof and a plurality of first guide holes 11b formed at one side thereof.

The lower plate 12 is in the form of a circular or a rectangular plate shape corresponding to the upper plate 11 and has a second containing groove 12a formed on one side of an upper surface thereof corresponding to the first containing groove 11a and a plurality of second guide holes 12b formed at one side thereof.

The upper plate 11 and the lower plate 12 serve to provide the forming area of the conductive trace 40, which will be described later, by means of the outer surfaces thereof and the inner surfaces formed by the first containing groove 11a and the second containing groove 12a.

The conductive layer 20 is formed at one side of the upper plate 11, in which the first guide holes 11b are formed, or one side of the lower plate, in which the second guide holes 12b are formed, through the coating of the conductive material. The conductive layer 20 serves to electrically connect the testing pin 30 and the conductive trace 40, which will be described later, to each other.

The testing pin 30 of an approximately rod shape is inserted into the first guide hole 11b and the second guide hole 12b to be arranged. One side thereof is electrically contacted with one side of the conductive layer 20 and it is connected electrically through the conductive layer 20 with the conductive trace 40 which will be described later. The testing pin 30 is electrically contacted with the conductive layer 20 and electrically connected to the conductive trace 40, which will be described later.

In the meantime, in the present embodiment, a cobra type probe is used as the testing pin 30. However, the present invention is limited to the cobra type probe. The testing pin 30 may be various probes such as a pogo pin or a wire probe etc.

Also, in the present embodiment, the guide plate includes the upper plate 11 and the lower plate 12. However, the guide plate can be formed with one body like a socket housing of a test socket.

The conductive trace 40 is formed on the surface of the guide plate 10 by using the conductive material. That is, the conductive trace 40 is formed on at least one surface of the inner and outer surfaces of the upper plate 11 and the lower plate 12. One side of the conductive trace 40 is connected to one side of the conductive layer 20. At this time, the conductive trace 40 can perform various functions depending on where the other side thereof is connected, as described below.

1. Connection Between the Conductive Layers with which the Testing Pin of Transmitting the Same Signal is Contacted As described above, the conductive trace 40 is formed on one side of the surface of the guide plate 10. Also, one side of the conductive trace 40 is connected to one side of the conductive layer 20 and the other side thereof is connected to one side of other conductive layer 20.

At this time, the conductive layers 20, with which the testing pin of transmitting the same signal is contacted, are connected to each other. For example, as shown in FIG. 3, the plurality of the conductive layers 20, with which the testing pin for ground is contacted, can be connected to each other. Accordingly, two testing pins for ground, several tens of the testing pins for ground, or several thousands of the testing pin for ground can be connected to each other according to the connectivity pattern.

As described above, since the conductive trace 40 according to one embodiment of the present invention allow the plurality of the conductive layers 20, with which the plurality of testing pin 30 of transmitting the same signal is contacted, to be connected to each other, although the poor contact E between one testing pin among the plurality of testing pins 30 of transmitting the same signal and the corresponding terminals of the space transformer 130 is generated as shown in FIG. 3, the correct test can be performed.

2. Connection Between Main Board (or Space Transformer) and Conductive Layer

As shown in FIG. 4, the conductive trace 40 can be extended and formed toward the external area W except for the testing area T of the surface of the guide plate 10, on which the testing pins 30 are densely formed, from one side of at least one conductive layer 20.

That is, since the conductive trace 40 allows the contact position between the testing pins 30 densely formed within the testing area and the space transformer to be extended to the outside of the testing area, the connection work with the space transformer is very easy and the stable contact can be maintained.

Also, since the conductive trace 40 according to one embodiment of the present invention can be directly connected to the main board without the separate space transformer on the external area W, which is deviated from the testing area T, it can remarkably improve the workability thereof. Also, since the signal transduction length becomes short and the impedance is decreased, it can remarkably improve the high frequency performance.

Moreover, according to one embodiment of the present invention, the conductive trace 40 can be extended to the external area W from the testing area T, so that the spatial restriction for forming the conductive traces 40 can be considerably solved. Accordingly, the conductive trace 40 has a large area and the conductive trace 40 and the main board are connected to each other by using the wire having a thick diameter, the radio frequency effect can be more improved.

In the meantime, in one embodiment of the present invention, the plurality of the conductive layers 20, with which the testing pins 30 of transmitting the same signal are contacted, and the conductive traces for connecting them are set to a plurality of groups and each group is formed at the upper surface and the lower surface of the upper plate 11 respectively, so that the testing pins 30 of transmitting the same signal in the narrow testing area can be easily connected.

For example, the plurality of the conductive layers 20, with which the testing pins 30 of transmitting the same signal are contacted, and the conductive traces 40 for connecting them are formed at the upper surface of the upper plate 11 as shown in FIG. 5*a* and the plurality of the conductive layers 20, with which the testing pins 30 for ground are contacted, and the conductive traces 40 for connecting them are formed at the lower surface of the upper plate 11 as shown in FIG. 5*b*, so that the testing pins 30 of transmitting the same signal can be easily connected without interfering with the testing pin 30 of transmitting the other signal.

Also, in the drawings, each group is formed at only the upper surface and the lower surface of the upper plate 11. However, the present invention is limited to the position of the groups. That is, each group can be formed at the upper surface and the lower surface of both upper and lower plates 11 and 12 according to the number of the groups. Also, at least one electrical connecting group can be formed on one surface thereof.

3. Connection with Conductive Layer in Lower Surface of Guide Plate.

In the meantime, as shown in FIG. 6, the conductive trace 40 can be extended to the external area W from the testing area T in a state that one side of the conductive trace 40 is connected to the conductive layer 20 at the lower surface of the guide plate 10, that is the lower surface of the lower plate 12. Then, the extended conductive trace 40 and the main board can be directly connected by using the wire.

Here, the high conductive trace 40 can minimize the signal transduction route through the testing pin 30 with a high impedance and the signal transmitted to the testing pin 30 can be directly transmitted to the main board 120 through the thick wire J, so that the noise is minimized, thereby remarkably improving the high frequency performance thereof.

Figure 7:
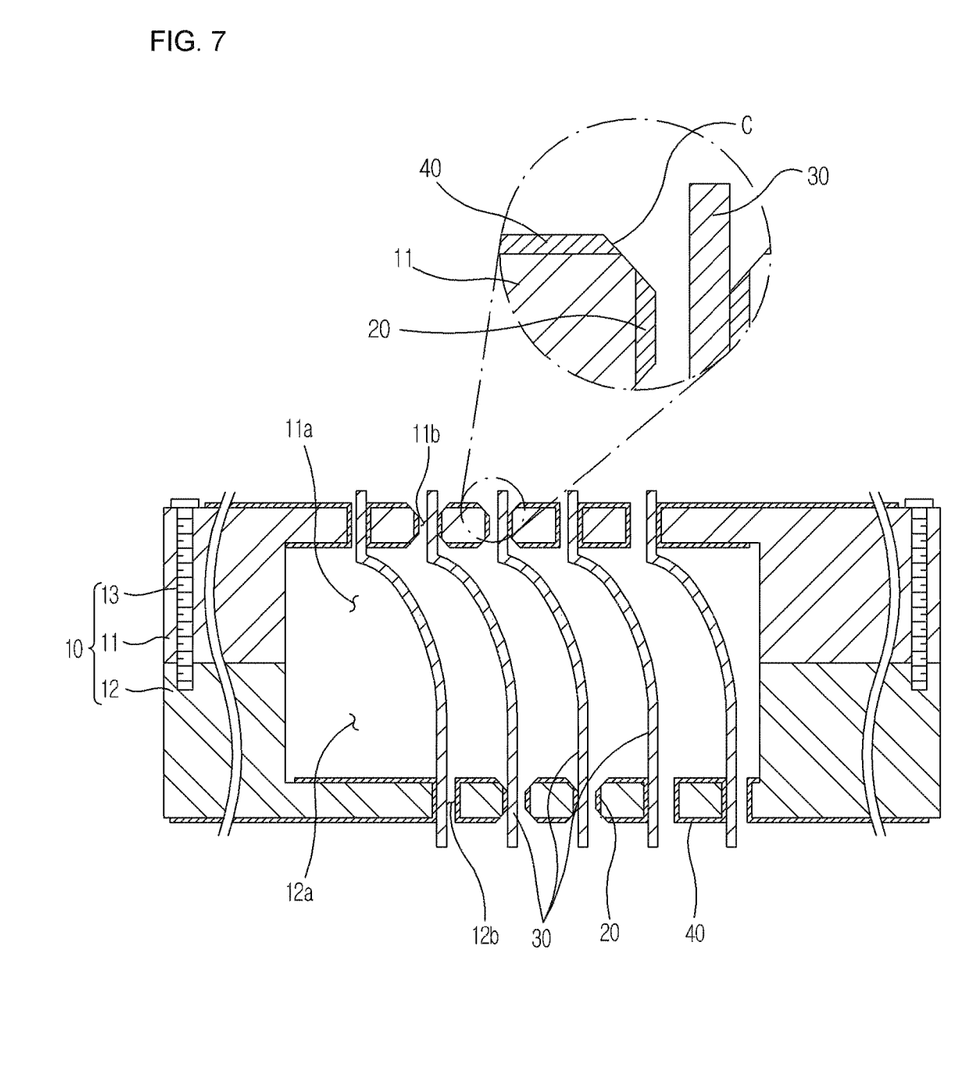
FIG. 7 is a drawing showing a state in that the conductive material is removed through a counter sink or a counter bore according to one embodiment of the present invention.

FIG. 7 is a drawing showing a state in that the conductive material is removed through a counter sink or a counter bore according to one embodiment of the present invention.

In the meantime, the conductive layer 20 and the conductive trace 40 according to one embodiment of the present invention can be manufactured by the following various method.

In the first method, after the conductive material is plated or deposited on the entire surface of the guide plate 10, a photoresistor film is formed on an area for forming the conductive layer 20 and conductive trace 40 among the plated or deposited conducive materials. Then, unnecessary areas among the conducive materials formed on the entire surface of the guide plate 10 are removed through an etching solution, so that it forms the conductive layer 20 and conductive trace 40.

In the second method, after a photoresistor is partially formed on the surface of the guide plate 10, in that the forming of the conductive layer 20 and conductive trace 40 is unnecessary, the conductive material is entirely plated or deposited thereon. Then, the conducive materials formed on the photoresistor are removed through a lift-off method, so that it forms the conductive layer 20 and conductive trace 40 in the desiring shape.

In the third method, after a screen is arranged on the surface of the guide plate 10, in that the forming of the conductive layer 20 and conductive trace 40 is unnecessary, the conductive material is deposited thereon, so that it forms the conductive layer 20 and conductive trace 40 in the desiring shape.

Here, the seed layer is formed on the area in which the screen is not arranged and the conductive layer 20 and conductive trace 40 can be formed through the electroplating method etc.

In the last method, the conductive materials are deposited on the entire surface of the guide plate 10 and then, the conductive materials are selectively removed from the surface of the guide plate 10 through the machining, so that it forms the conductive layer 20 and conductive trace 40 in the desiring shape.

For example, where it is intended to connect the testing pins 30 for ground to each other through the conductive layer 20 and conductive trace 40, as shown in FIG. 7, the conductive materials formed at the corner of the guide plate corresponding to the guide hole, into which the testing pins 30 except for the testing pins 30 for ground are inserted, that is the entrance of the guide hole 11*a* is removed through the counter sink or the counter bore C, so that the testing pins 30 for signal or the testing pins 30 for power are insulated with the testing pins 30 for ground, thereby connecting the plurality of the testing pins 30 of transmitting the same signal to each other.

According to the present invention, the testing pin is rendered to electrically connect to another testing pin or an external substrate through the conductive layer formed in the guide hole, thus resulting in enhancement in various characteristics such as poor electrical contact of the testing pin, space efficiency, noise, and high frequency characteristics. Accordingly, increased reliability in testing results may be obtained.

Also, after the testing pins of transmitting the same signal are electrically connected to each other through a lower surface of the lower plate of the guide plate, the conductive trace 40 is electrically connected to the main board through the external area deviated from the testing area, so that the signal transduction route is minimized through the testing pin and the impedance is decreased, thereby remarkably improving the high frequency performance.

Although the invention has been described according to the preferred embodiment mentioned above, the invention can be variously changed and modified without deviating from the essential point and scope of the invention. Accordingly, the accompanying Claims include such change and modification belonging to the essential point of the invention.

What is claimed is:
1. A semiconductor testing apparatus comprising:
 a guide plate having at least one or more guide holes formed at one side thereof;
 a conductive layer formed at one side of an inner surface of the guide hole;
 at least one testing pin inserted and installed in the guide hole and having one side of an outer surface contacted with one side of the conductive layer and a lower end portion electrically contacted with a semiconductor under test; and
 at least one or more conductive traces formed at one side of a surface of the guide plate and having one side electrically connected to one side of the conductive layer,
 wherein the conductive trace is electrically connected between the conductive layers with which the testing pins of transmitting the same signal are contacted, and the conductive trace is extended and formed toward an area except for a testing area of a side of the guide plate, on which the testing pins are densely formed, from one side of the conductive layer.

2. A semiconductor testing apparatus, as claimed in claim 1, wherein the guide plate comprises an upper plate having at least one first guide hole formed at one side thereof and a lower plate coupled to the lower portion of the upper plate and having at least one second guide hole formed at one side thereof; and the conductive trace is formed on at least one surface of upper and lower surfaces of the upper plate or the lower plate.

3. A semiconductor testing apparatus, as claimed in claim 1, wherein the conductive trace is electrically connected between the conductive layers with which the testing pins for ground are contacted.

* * * * *